United States Patent [19]

Cummings et al.

[11] 4,199,723
[45] Apr. 22, 1980

[54] AUTOMATIC MODULATION CONTROL APPARATUS

[75] Inventors: Forest M. Cummings, Richardson; Jack S. Sellmeyer, Dallas, both of Tex.

[73] Assignee: Rockwell International Corporation, El Segundo, Calif.

[21] Appl. No.: 881,100

[22] Filed: Feb. 24, 1978

[51] Int. Cl.² ............................................. H04B 1/04
[52] U.S. Cl. ........................................ 455/108; 332/38; 455/126
[58] Field of Search ............... 325/144, 159, 182, 187, 325/186; 332/38

[56] References Cited

U.S. PATENT DOCUMENTS

| | | | |
|---|---|---|---|
| 3,662,290 | 5/1972 | Elliott | 332/38 |
| 3,943,446 | 3/1976 | Quidort | 325/159 |
| 4,088,956 | 5/1978 | Axman | 325/159 |

OTHER PUBLICATIONS

Radio Shack–Dictionary of Electronics–Rudolf F. Graf, 1974, p. 165.

*Primary Examiner*—Marc E. Bookbinder
*Attorney, Agent, or Firm*—Bruce C. Lutz; Howard R. Greenberg; H. Fredrick Hamann

[57] ABSTRACT

The present invention concerns circuitry for comparing the output power of an amplitude modulated RF transmitter with the supply power to the RF transmitter and using feedback from a comparator to a variable gain modulation amplifier to maintain the level of modulation constant. The scheme is illustrated for four different basic types of RF amplitude modulated transmitters.

2 Claims, 6 Drawing Figures

AUTOMATIC MODULATION CONTROL APPARATUS

THE INVENTION

The present invention is primarily concerned with electronics and more specifically concerned with RF power transmitters. Even more specifically it is concerned with a means for maintaining the modulation level of the transmitter always at a given percent or depth of the output power from the transmitter for a given input.

In all known prior art, AM RF transmitters are affected as to output by a change in the voltage and accordingly the power supplied thereto. In other words, changes in the power supply affected or otherwise modulated the output signal. If there are variations in the power supplied to the transmitter, it is desirable that these not be reflected in amplitude modulation of the output signal.

The present invention provides circuitry for measuring the output carrier power of the transmitter as compared with a signal indicative of the power being received by the RF power amplifier. This comparison is used to adjust the gain of a modulation amplifier to keep the comparison ratio constant. The power can be sampled in some cases by checking the output voltage of the DC power supply and in other cases by merely checking the voltage of the AC power input.

As is well-known, the output power of many AM transmitters must, by FCC (Federal Communications Commission) regulations, be reduced after a certain time in the evening. When such an alteration in output power is affected, it is necessary to reduce the amount of audio signal reaching the modulator so as to prevent overmodulation. The present invention, when used in a pulse-width modulated circuit, will readily vary the gain of the modulation amplifier to keep the percentage modulation of the output signal constant when the output power is altered as suggested above (defined hereinafter as "constant system gain").

It is thus an object of the present invention to provide an automatic modulation gain control in an RF transmitter.

Other objects and advantages of the present invention may be ascertained from a reading of the specification and appended claims in conjunction with the drawings wherein:

DETAILED DESCRIPTION

Figure 1:
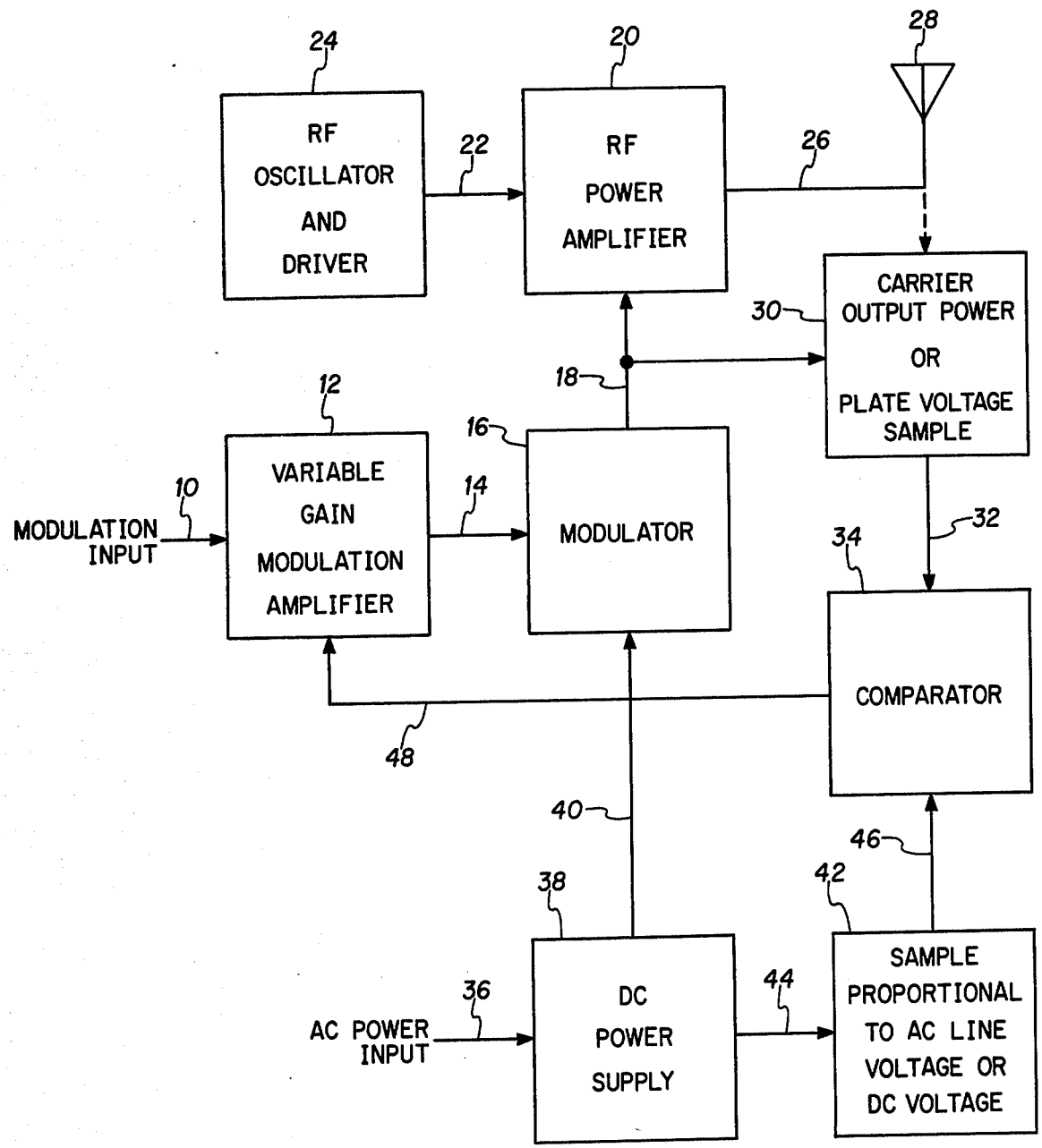
FIG. 1 is a block schematic diagram of the inventive concept as applied to a cathode connected pulse-width modulating type RF transmitter.

In FIG. 1 a modulation input lead 10 supplies audio representative or other modulating input signals to a variable gain modulation amplifier 12 which supplies output signals on a lead 14 to a modulator 16. Modulator 16 supplies output signals on a lead 18 to an RF power amplifier 20 receiving RF carrier signals on a lead 22 from an RF oscillator and driver 24. An output of RF power amplifier 20 is supplied on a lead 26 to an antenna 28. Lead 18 is also supplied to a carrier output power or plate voltage sample block 30 which is illustrated as receiving a dash line connection to lead 26. The block 30 can receive its signals either from lead 18 or from 26 and thus the reason for the dash line connection. An output of sample block 30 is provided on lead 32 to a comparator 34. The alternating power input is illustrated on lead 36 to a DC power supply circuit 38 having an output on lead 40. Lead 40 is supplied to modulator 16. A sample proportional to AC line voltage block 42 is connected to power supply 38 to receive signals therefrom on a lead 44. It is to be understood that this sample may be obtained by any of several means such as magnetic coupling, or direct electronic connection. In view of the many ways of obtaining a representative sample and since in some instances it is appropriate to measure one of the DC or AC voltages rather than the other, a connection was not illustrated. It is to be understood, however, that some type of coupling or connection would be required to obtain the indicated sample. The distinction between a fixed reference or a sample proportional to the AC line voltage lies in the presence or absence of automatic power control in the transmitter. If automatic power control is included, the sample proportional to AC line voltage may be used; if not, a fixed DC reference may be used. Either one of these, in appropriate types of power supplies, will be representative of the power supplied to the RF transmitter comprising modulator 16 and amplifier 20. The output from block 42 is supplied on a lead 46 to comparator 34. The compared output from 34 is supplied on a lead 48 to the variable gain modulation amplifier 12.

Figure 2:
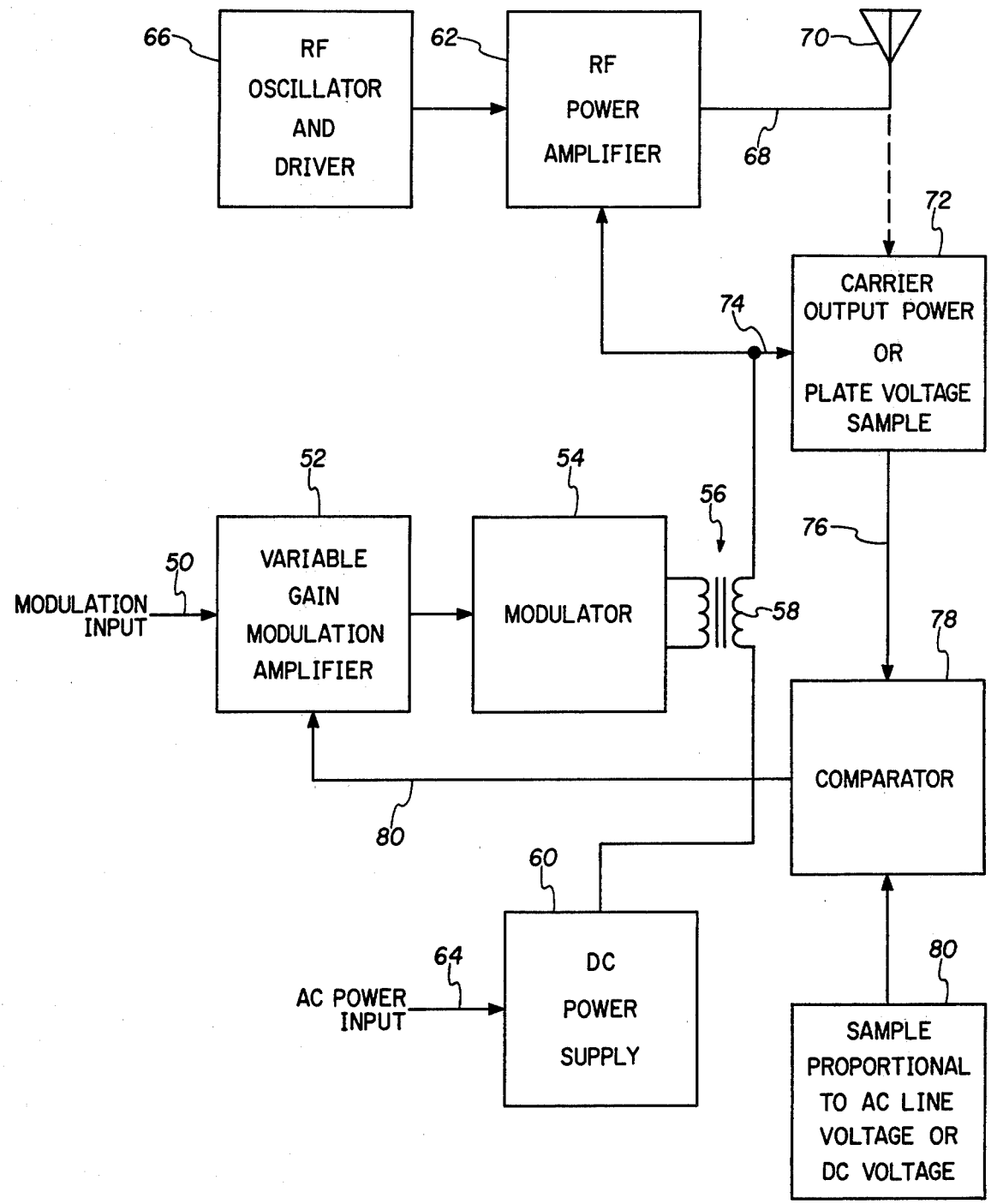
FIG. 2 is a block diagram of the inventive concept as applied to the conventional high level modulated transmitter using the audio signal directly to amplitude modulate the RF power amplifier.

In FIG. 2 a modulation input 50 is supplied to a variable gain modulation amplifier 52 which provides output signals to a modulator 54. An output of modulator 54 is supplied to an audio transformer 56 which has a secondary winding 58 connected in series between a DC power supply 60 and an RF power amplifier 62. DC power supply 60 is supplied with AC power on a lead 64. An RF oscillator and driver 66 supplies carrier signals to the amplifier 62. An output of amplifier 62 is supplied on a lead 68 to an antenna 70. A carrier output or plate voltage sample block 72 is connected to receive signals on a lead 74 from the secondary 58 of modulator 56 and is shown with a dash line connection to lead 68. This sample device may take the representative signals from either lead 68 or 74 to provide an output on lead 76 to a comparator 78. A DC voltage reference block 80 is connected to supply further signals to comparator 78 which then supplies output signals on lead 82 to the variable gain modulation amplifier 52.

Figure 3:
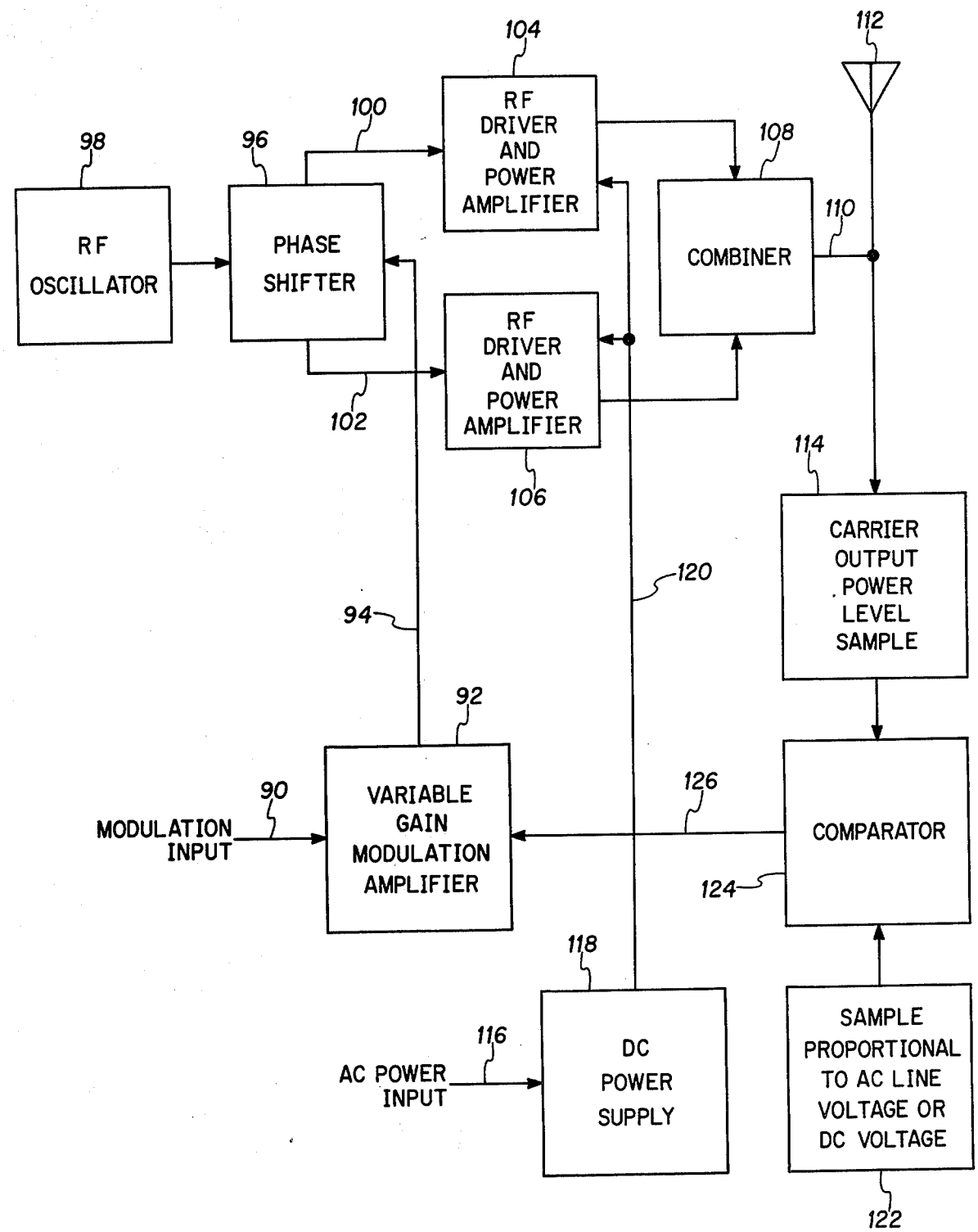
FIG. 3 is a block diagram of the present invention as applied to a phase to amplitude modulated RF transmitter.

In FIG. 3 a modulation input lead 90 supplies signals representative of an audio input to a variable gain modulation amplifier 92 which supplies outputs on a lead 94 to a phase shifter 96. An RF oscillator 98 supplies carrier signals to the phase shifter 96 which phase shifts the signals in accordance with signals from 94 and outputs the signals as oppositely phased vectors on leads 100 and 102 to RF driver and power amplifiers 104 and 106 respectively. The outputs of these two amplifiers are combined in a combiner 108 and output on a lead 110 to an antenna 112 and to a carrier output power level sample block 114. An AC power input is supplied on a lead 116 to a DC power supply 118 which supplies power to the two amplifiers 104 and 106 on a lead 120. A reference voltage or sample proportional to AC line voltage block 122, depending upon whether internal automatic power control is incorporated in the transmitter, supplies signals to a comparator 124 which also receives signals from block 114 and supplies control output signals on a lead 126 to the amplifier 92.

Figure 4:
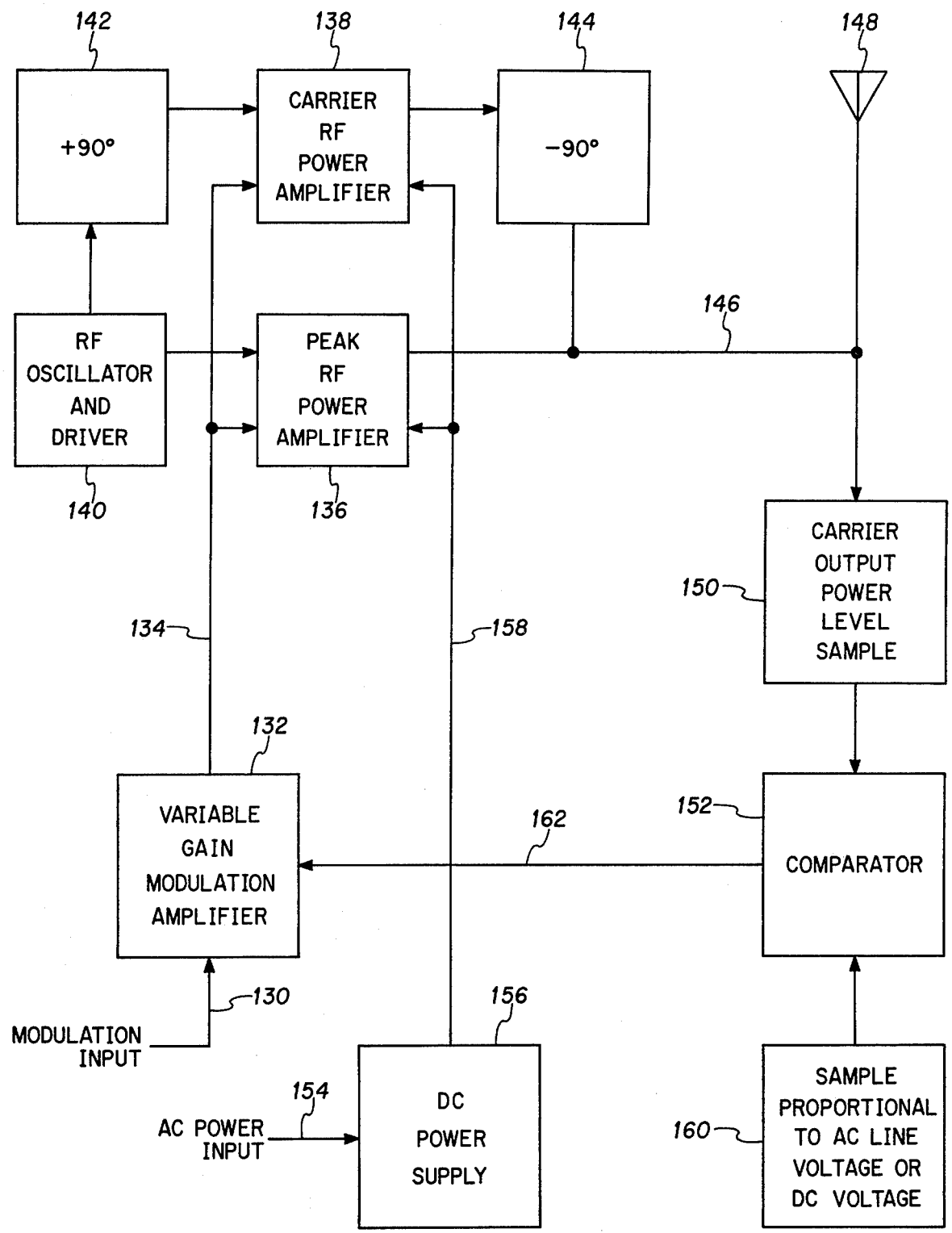
FIG. 4 is a block diagram of the invention as applied to a Doherty type modulated RF transmitter.

In FIG. 4, signals representative of an audio or other modulation input signal are shown supplied on a lead 130 to a variable gain modulation amplifier 132 which provides output signals on a lead 134 to a peak RF power amplifier 136 and a carrier RF power amplifier 138 respectively. An RF oscillator and driver 140 supplies signals to the amplifier 136 as well as through a 90 degree phase shifting block 142 to an input of carrier amplifier 138. Output signals from power amplifier 138 are again phase shifted minus 90 degrees in a block 144 before being combined with outputs from the power amplifier 136 on a lead 146 and applied to an antenna 148. Lead 146 is also connected to supply signals representative of the carrier output power level in a block 150 which has an output connected to a comparator 152. Alternating current is supplied on a lead 154 to a DC power supply 156 which supplies power on a lead 158 to the blocks 136 and 138 respectively. A block 160 supplies a DC voltage reference to comparator 152 which provides the comparison output on a lead 162 to amplifier 132.

Figure 5A:
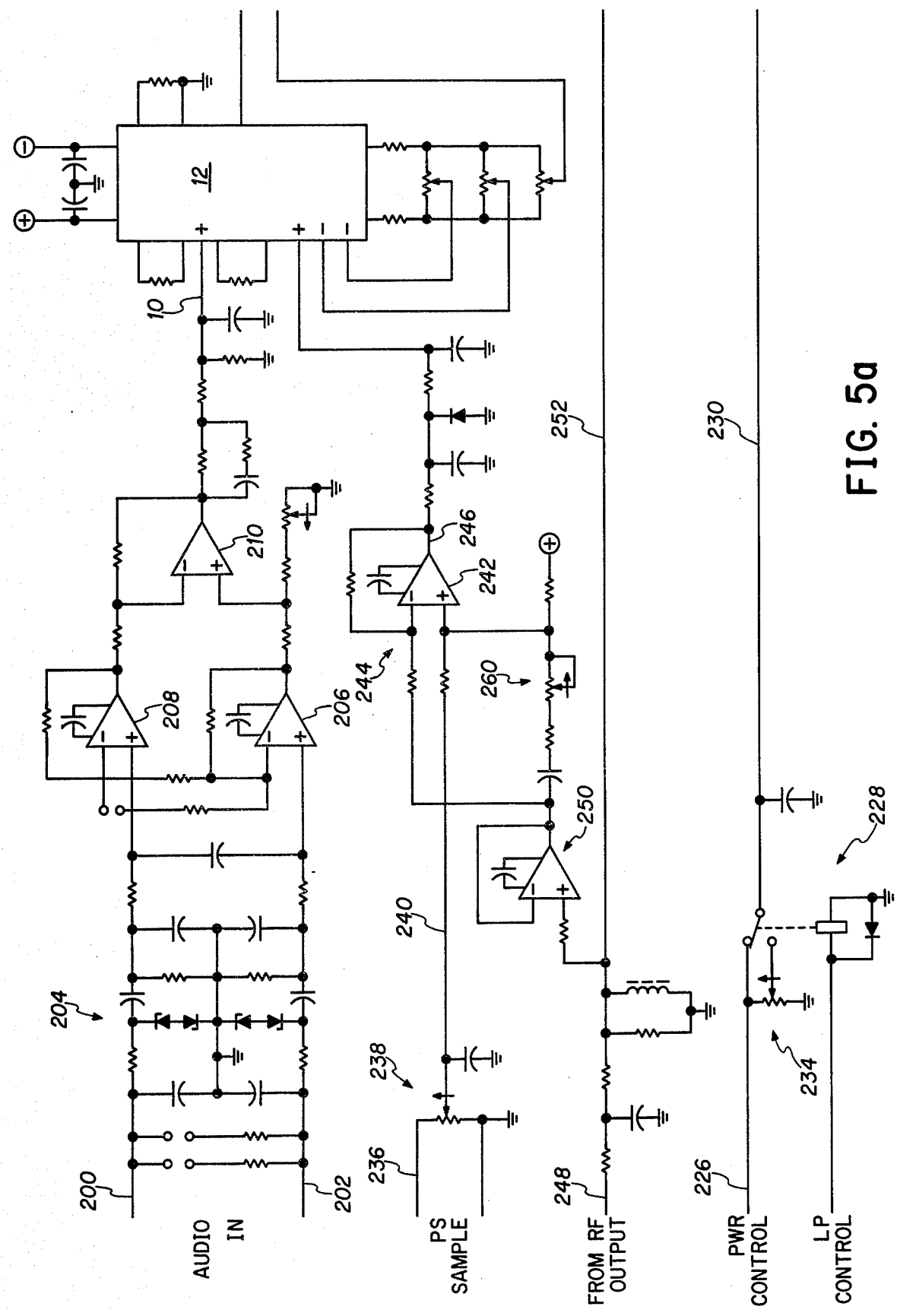
FIGS. 5a and 5b are a specific circuit diagram used in practicing the invention in an RF transmitter of the type illustrated in FIG. 1.
Figure 5B:
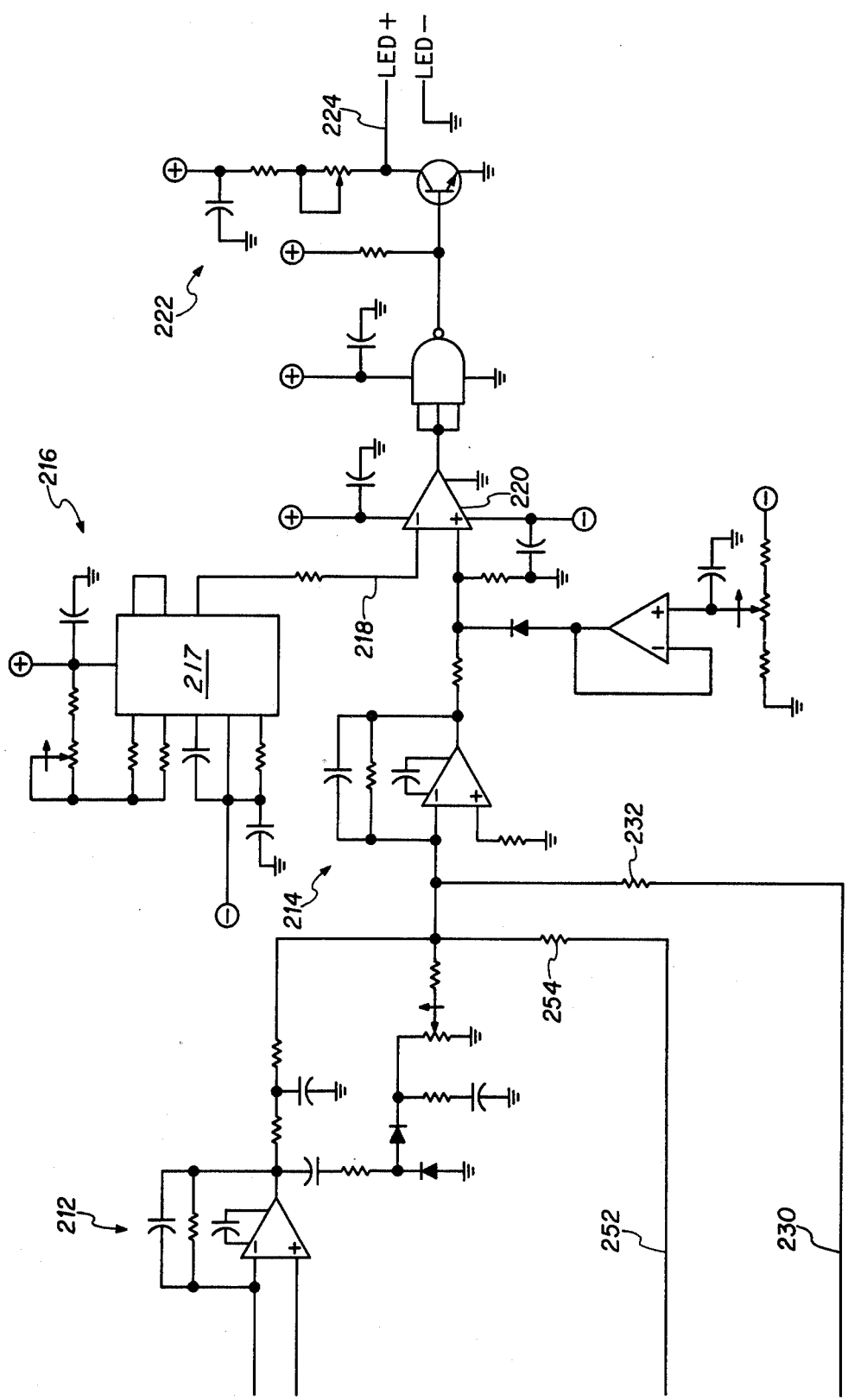

In FIGS. 5a and 5b audio input signals are supplied on leads 200 and 202 and after passing through various circuitry generally indicated as 204 arrive at the inputs of two amplifiers 206 and 208 to be combined in a circuit operating as an electronic transformer. The outputs of these signals are supplied to an amplifier 210 which also is part of the electronic transformer. The signal at the output of this amplifier 210 is representative of the signal appearing at lead 10 in FIG. 1. This signal is supplied to an input of a block generally designated as 12 which is a variable gain modulation amplifier. Block 12 may be purchased from any of several manufacturers such as Motorola under part number MC1494L. An output from this block 12 is passed through an amplifier and associated circuit generally designated as 212 wherein the signal is converted from current to voltage before being applied as one of a multiple of inputs to a circuit generally designated as 214. A triangular waveform generator 216 is shown supplying signals on a lead 218 to an amplifier 220 which comprises part of the circuitry for the pulse-width modulator. A block 217 in generator 216 may be an IC such as a part number 8038 purchased from Intersil, Inc. A modulate DC signal is supplied from circuit 214 to determine the point at which the amplifier 220 switches and produces the pulse-width modulation. The output of amplifier 220 is then passed through isolation circuits generally designated as 222 before being output on a lead 224. This output lead is supplied to an LED portion of a fiber optic coupler which is the subject of a co-pending application Ser. No. 881,099, filed Feb. 24, 1978, and assigned to the same assignee as the present invention. A reference DC signal from a first potentiometer is supplied on a lead 226, through a controlled switch generally designated as 228 to a lead 230 which supplies signals through a resistor 232 to an input of amplifier 214. A second potentiometer generally designated as 234 is also used for providing a reduced reference signal to the amplifier 214. Signals are supplied on a lead 236 indicative of the AC line voltage such as 36 of FIG. 1 or indicative of the DC voltage such as on lead 40 of FIG. 1. These signals are then supplied through a potentiometer 238 on a lead 240 to an input of an amplifier 242 forming part of a comparator generally designated as 244. An output of comparator 244 supplies signals on a lead 246 which are applied as a control input to block 12. A further input 248 is representative of the carrier output power level or plate voltage such as 26 or 18 respectively in FIG. 1. These signals are supplied through an isolating amplifier 250 to both inputs of comparator 244 where AC signal cancelation occurs leaving only a DC control signal. In addition, these signals are supplied on a lead 252 through a resistor 254 to a summing input of amplifier circuit 214.

Although many of the specific resistors and capacitors of FIGS. 5a and 5b have not been designated, it is believed that the general functions named will enable anyone skilled in the art to accomplish the result intended in the present inventive concept.

OPERATION

In the prior art, as was previously explained, if the AC line voltage changed thereby causing a change in the output of the DC power supply, or if the average modulated DC voltage changed (effectively the carrier output power), then the modulation level would be either too high or too low depending upon the direction in which they varied. As a result, either under or overmodulation would occur until the modulation level was readjusted by the operator. The present invention utilizes the variable gain modulation amplifier such as 12 in FIG. 1 in combination with sampling devices and a comparator to automatically adjust the amplitude of the modulating signal to the modulator 16 to maintain a desired amount of modulation with a given amplitude signal as originally set by the operator. The operator will define a peak input signal and adjust the device to obtain full modulation with this given signal. If at some later time, the power output was reduced or if the power line voltage changed, a new adjustment needed to be made in the prior art to maintain the proper level of modulation. Since the operator could not continually readjust the transmitter, changes in the power supply or power output level would merely alter the device from the proper level of modulation. These alterations would be detected at the receiving end as distortion if overmodulation occurred or a weak signal if undermodulation occurred.

In order to obtain full modulation, the peak modulating voltage must be equal to the DC voltage supplied to the transmitter. The plate voltage of the RF power amplifier is representative of the carrier output power. With unregulated DC power supplies, the AC voltage input is representative of the DC voltage supplied to the transmitter unit. Thus, for the purposes of illustration, a sample of the AC line voltage and a sample of the plate voltage will provide indications of the desired quantities. By comparing the relative values of these two samples, a signal can be provided to the variable gain device 12 to adjust the modulating voltage at lead 14 and thereby alter the level of modulation of the transmitter. This will occur because modulator 16 is a pulse-width modulating type of device which in effect adjusts the voltage which is dropped between leads 40 and 18 thus modulating the plate voltage appearing on the power amplifier 20.

Referring to FIGS. 5a and 5b it will be noted that a reference signal is supplied on lead 226 which may be a signal indicative of desired power output. This signal is applied on lead 230 to the input of amplifier 214. This reference DC signal is compared with a feedback DC signal on lead 252 as obtained from the modulated DC on lead 18 or from the output of the power amplifier on lead 26. If the circuit has just been energized and there is no power to the antenna, the current on 230 will drive the amplifier within 214 in such a direction that the triangular signal on lead 218 produces pulse widths of a nature that will provide minimum voltage drop across the modulator 16 of FIG. 1. This will increase the plate voltage on the output tube of block 20 and start the signal being fed back on 252 rising. As this signal rises, the point at which the triangular wave matches the voltage supplied from amplifier 214 changes so as to continually increase the voltage drop across modulator 16. This of course reduces the voltage supplied to power amplifier 20 even if the DC voltage supplied to the transmitter on lead 40 remains constant. At some point the voltage across modulator 16 increases to an extent that the DC signals on leads 230 and 252 nearly cancel each other and the amplifier 214 is not altered any further. This portion of the circuit thus provides the initial setting for carrier power output from amplifier 20 of FIG. 1. If the input to output terminals of the variable gain amplifier 12 were shorted, the circuit would still be very similar to that provided in some of the prior art. In other words, signals on leads 200 and 202 would be used to provide modulating signals on lead 224 to the LED from whence the signals would be amplified in power amplifier 20 and output. However, the present concept utilizes the signals on leads 236 and 248. The signals on 248 are passed through amplifier 250 subsequent circuitry to amplifier 242 which removes the alternating frequency component such that the comparator 244 compares the two direct voltage signals and provides an output on lead 246 to adjust the gain of block 12 accordingly. As will be noted, the audio signal is applied to both inputs and is adjusted to have equal effects by the audio null potentiometer 260. If either of the signals on leads 236 or 248 vary with respect to the other, the alteration will be noted and this will alter the gain of amplifier 12 to maintain the proper level of modulation.

As a specific example it may be assumed that the sample from the block 42 is reduced in value. Thus, there would be less total voltage available to the RF transmitter. With less total voltage available, the average pulse width would increase to maintain the average carrier level. With the same modulation signal level the device would undermodulate. However, this lowered signal will provide an output to amplifier 12 such that its gain is increased to prevent the undermodulation. If on the other hand the signals from block 42 increased, showing that the power supply voltage has increased, the opposite effect occurs in amplifier 12 and the gain through the amplifier is accordingly decreased.

If the signal on lead 230 is lowered (which because of the feedback lowers the voltage on lead 248) the input signals to comparator circuit 244 also reduce the gain of amplifier 12. Although this is applied to the other input of amplifier 242, it produces the same effect because of the inversion in unit 250. Again, the same percentage modulation will occur in the output signal for a given audio input signal on lead 10.

Turning now to FIG. 2 it will be noted that the modulator 54 provides an output signal to a transformer 56 whose secondary 58 is in series between the power supply 60 and the RF power amplifier 62. This transformer 56 must be an audio transformer and is very large in comparison to any transformers or inductances used in the more energy efficient pulse-width modulation techniques used today. However, the purpose of the transformer is identical with that of the modulator 16 in FIG. 1. That is, the purpose is to adjust the voltage on the power amplifier 62 in accordance with an audio signal so as to amplitude modulate the carrier derived from oscillator 66. It will be noted that the signal from transformer 56 both adds to and subtracts from the voltage supplied by power supply 60 as distinguished from subtraction only in FIG. 1.

In any event the carrier output power may be derived from either directly receiving signals on line 74 for the plate voltage or from the antenna 70 on lead 68 much in the same manner as FIG. 1. Since there is no DC feedback, the carrier power changes when the DC voltage on lead 74 varies due to variation in AC input voltage and thus in output voltage from block 60. (For the purposes of this specification and claims "DC voltage reference" includes both the variable power supply voltages and the regulated references as used in FIGS. 2, 3 and 4). The comparator 78 then takes the comparison between the sample on lead 76 and the reference 80 and provides an output on lead 82 which adjusts the gain of 52 so as to maintain a given percentage modulation for a given amplitude audio input signal on lead 50. Thus, again the comparator 78 acts to adjust the output of modulator 54 such that the ratio between the peak modulating voltage and the voltage supplied to the transmitter from DC power supply 60 stays in a constant relationship.

FIG. 3 illustrates a phase to amplitude modulated RF transmitter wherein the comparator is connected to receive signals from the antenna 112 in block 114 so as to provide a sample indicative of the carrier output power level. This is compared with a signal indicative of the voltage supplied from power supply 118 to the amplifiers 104 and 106 if DC feedback is used or a reference if it is not used. If this comparison does not indicate the desired relationship, the gain of amplifier 92 is adjusted so that more or less modulation is provided to obtain the desired relationship. Thus, the modulation in the output signal is again maintained at a desired percentage of modulation. In other words, 92 is adjusted so that a given modulation is obtained for any average given input on 90 and this adjustment will occur automatically regardless of the voltage supplied by power supply 118 to the RF transmitter. As indicated previously, this concept will work even when the total output power is altered by changing the power available from supply 118 under mandatory reduced power output conditions.

FIG. 4 is similar to the other three block diagrams in that again the carrier output power level is sampled and compared to a DC reference voltage and the comparison provides a signal on 162 to adjust the gain in modulation amplifier 132 such that the two values are maintained in a prescribed relationship.

While the present inventive concept has been described with respect to four different types of RF amplitude modulated transmitters, it is to be realized that other circuits may be used to implement the present inventive concept and thus we wish to be limited only by the scope of the appended claims.

We claim:

1. RF transmitter apparatus for maintaining constant modulation index conditions comprising, in combination:

RF power amplifier means for supplying AM power output signals to an antenna;

variable gain modulation means, including modulation signal input means and control signal input means, connected to said RF power amplifier means for supplying modulating signals thereto, the signal gain through said modulation means varying as a function of a signal supplied to said control input thereof;

power supply means, connected to said RF power amplifier means;

comparator means, connected to said RF power amplifier means, said power supply means and said control signal input means of said modulation amplifier means, for supplying control signals to said control signal input means indicative of the relative value of the voltage of said power supply means and the carrier power level of the RF power amplifier means; and PWM (pulse-width modulated) means and filter means, connected between said power supply means and said RF power amplifier means and connected to said variable gain modulation amplifier means for varying the effective voltage across said RF power amplifier means in accordance with signals received from said modulation means.

2. RF transmitter apparatus for maintaining constant modulation index conditions comprising, in combination:

RF power amplifier means for supplying AM power output signals to an antenna;

variable gain modulation means, including modulation signal input means and control signal input means, connected to said RF power amplifier means for supplying modulating signals thereto, the signal gain through said modulation means varying as a function of a signal supplied to said control input thereof;

power supply means, connected to said RF power amplifier means;

comparator means, connected to said RF power amplifier means, said power supply means and said control signal input means of said modulation amplifier means, for supplying control signals to said control signal input means indicative of the relative values of the voltage of said power supply means and the carrier power level of the RF power amplifier means;

said RF power amplifier means includes phase shifting means for providing a variable phase output in accordance with signals received from said variable gain modulation amplifier means and combining means for recombining the phase shifted signals after amplification; and additionally includes RF carrier signal means for applying signals to said RF power amplifier means, said carrier signals being divided and shifted in phase in the phase shifting means of said RF power amplifier means.

* * * * *